United States Patent
Sperlich et al.

(10) Patent No.: US 11,444,211 B2
(45) Date of Patent: Sep. 13, 2022

(54) CRYSTALLINE SOLAR CELL COMPRISING A TRANSPARENT, CONDUCTIVE LAYER BETWEEN THE FRONT-SIDE CONTACTS AND METHOD FOR PRODUCING SUCH A SOLAR CELL

(71) Applicant: Meyer Burger (Germany) GmbH, Hohenstein-Ernstthal (DE)

(72) Inventors: Hans-Peter Sperlich, Dresden (DE); Gunter Erfurt, Freiberg (DE); Thomas Grosse, Glauchau (DE); Marcel König, Chemnitz (DE)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 141 days.

(21) Appl. No.: 16/348,510

(22) PCT Filed: Nov. 9, 2017

(86) PCT No.: PCT/EP2017/078699
§ 371 (c)(1),
(2) Date: May 9, 2019

(87) PCT Pub. No.: WO2018/087201
PCT Pub. Date: May 17, 2018

(65) Prior Publication Data
US 2020/0058806 A1 Feb. 20, 2020

(30) Foreign Application Priority Data
Nov. 9, 2016 (EP) ..................... 16197972

(51) Int. Cl.
*H01L 31/0216* (2014.01)
*H01L 31/0224* (2006.01)
(Continued)

(52) U.S. Cl.
CPC .... *H01L 31/02167* (2013.01); *H01L 21/0262* (2013.01); *H01L 21/02172* (2013.01);
(Continued)

(58) Field of Classification Search
CPC ......... H01L 31/02167; H01L 31/02168; H01L 31/022425; H01L 31/068; H01L 31/1884;
(Continued)

(56) References Cited

U.S. PATENT DOCUMENTS

| 2009/0165855 A1* | 7/2009 | Sun | H01L 31/1868 136/261 |
| 2010/0035030 A1* | 2/2010 | Huang | C23C 14/5813 428/201 |

(Continued)

FOREIGN PATENT DOCUMENTS

| CN | 101611497 A | 12/2009 |
| CN | 102498573 A | 6/2012 |

(Continued)

OTHER PUBLICATIONS

PV-manufacturing.org retrieved from https://pv-manufacturing.org/pecvd-of-silicon-nitride/on Mar. 24, 2021.*
(Continued)

*Primary Examiner* — Christina Chern
(74) *Attorney, Agent, or Firm* — Heslin Rothenberg Farley & Mesiti P.C.

(57) ABSTRACT

A monofacial or bifacial crystalline solar cell, on the front face of which over the entire area a first surface passivation layer is arranged directly on the semiconductor interface and above this a first optically opaque, electrically conductive material is arranged in first lateral regions as a front face contact, and a first optically transparent, electrically conductive material is arranged exclusively in second lateral regions. The first optically transparent, electrically conduc-
(Continued)

tive material is electrically conductively connected to the front face contact and to a first region of the semiconductor material of the solar cell. The method provides for application of the first optically transparent, electrically conductive material only after the first optically opaque, electrically conductive material has been applied, in such a way that firing of the front face contact is avoided.

26 Claims, 5 Drawing Sheets

(51) Int. Cl.

| | | |
|---|---|---|
| H01L 31/18 | (2006.01) | |
| H01L 31/068 | (2012.01) | |
| H01L 21/02 | (2006.01) | |
| H01L 21/285 | (2006.01) | |

(52) U.S. Cl.
CPC .. *H01L 21/02274* (2013.01); *H01L 21/28562* (2013.01); *H01L 31/02168* (2013.01); *H01L 31/022425* (2013.01); *H01L 31/022475* (2013.01); *H01L 31/022483* (2013.01); *H01L 31/068* (2013.01); *H01L 31/1868* (2013.01); *H01L 31/1884* (2013.01)

(58) Field of Classification Search
CPC ......... H01L 21/02172; H01L 21/02274; H01L 21/0262; H01L 21/28562
See application file for complete search history.

(56) References Cited

U.S. PATENT DOCUMENTS

| | | | | |
|---|---|---|---|---|
| 2011/0088764 | A1* | 4/2011 | Tsai | H01L 31/056 |
| | | | | 136/255 |
| 2011/0114171 | A1* | 5/2011 | Meier | H01L 31/068 |
| | | | | 136/256 |
| 2011/0120551 | A1* | 5/2011 | Prince | B22F 1/0059 |
| | | | | 136/256 |
| 2011/0139230 | A1* | 6/2011 | Rohatgi | H01L 31/1804 |
| | | | | 257/E21.135 |
| 2011/0162706 | A1* | 7/2011 | Borden | H01L 31/1864 |
| | | | | 136/256 |
| 2011/0277825 | A1* | 11/2011 | Fu | H01L 31/1884 |
| | | | | 438/96 |
| 2012/0305063 | A1* | 12/2012 | Moslehi | H01L 31/03921 |
| | | | | 136/256 |
| 2014/0099443 | A1* | 4/2014 | Park | C23C 16/448 |
| | | | | 427/250 |
| 2015/0034141 | A1* | 2/2015 | Albaugh | H01B 1/22 |
| | | | | 136/244 |
| 2018/0062008 | A1* | 3/2018 | Xie | H01L 31/1884 |

FOREIGN PATENT DOCUMENTS

| | | |
|---|---|---|
| CN | 202855746 U | 4/2013 |
| CN | 103094394 A | 5/2013 |
| CN | 103710680 A | 4/2014 |
| CN | 104465799 A | 3/2015 |
| DE | 3831857 A1 | 3/1990 |
| DE | 102011002280 A1 | 10/2012 |
| DE | 102013219561 A1 | 4/2015 |
| EP | 0548863 A1 | 6/1993 |
| EP | 2077584 A2 | 7/2009 |
| JP | 2009164544 A | 7/2009 |
| JP | 2012069538 A | 4/2012 |
| JP | 20130524514 A | 10/2013 |
| JP | 2016012590 A | 1/2016 |
| KR | 20120088029 A | 8/2012 |
| TW | 200929575 A1 | 7/2009 |
| TW | 201203588 A1 | 1/2012 |
| TW | 201411658 A | 3/2014 |

OTHER PUBLICATIONS

Barankin et al. ("Plasma-enhanced chemical vapor deposition of zinc oxide at atmospheric pressure and low temperature"), Solar Energy Materials & Solar Cells 91 (2007) 924-930.*

* cited by examiner

CRYSTALLINE SOLAR CELL COMPRISING A TRANSPARENT, CONDUCTIVE LAYER BETWEEN THE FRONT-SIDE CONTACTS AND METHOD FOR PRODUCING SUCH A SOLAR CELL

CROSS REFERENCE TO RELATED APPLICATIONS

This application is the U.S. national stage of International Application No. PCT/EP2017/078699, filed on 2017 Nov. 9. The international application claims the priority of EP 16197972.9 filed on 2016 Nov. 9; all applications are incorporated by reference herein in their entirety.

BACKGROUND

The invention relates to a crystalline solar cell made of a semiconductor material, which has a transparent conductive layer between the electrical contacts on the front face, and to a method for manufacturing a solar cell of this type.

Conventional Si solar cells consist of two oppositely doped regions of a monocrystalline or polycrystalline semiconductor material. A direct pn junction between the two regions is produced by introducing doping agents into the semiconductor material or by applying a layer made of the same semiconductor material to a first layer of the semiconductor material, the second layer having a doping opposite to the doping of the first layer. A solar cell of this type is also known as a homojunction cell, as opposed to a heterojunction cell, which consists of different semiconductor materials or has a further intrinsic layer between the n and the p layer (pin junction). Any other structure of semiconductor, for example amorphous instead of crystalline, is treated as being a different semiconductor material in this context. The oppositely doped regions of the solar cells are electrically contacted, in many solar cells the contacts being arranged on mutually opposite surfaces of the semiconductor material, in other words on the front face and the rear face of the solar cell. To improve the performance of the solar cell, the surfaces of the semiconductor material are often passivated using dielectric layers, these passivation layers being transparent on the front face of the solar cell, i.e. on the face pointing towards the light source, and often also having an antireflection effect or being supplemented with an antireflection layer.

The electrical contacts are only formed locally, at least on the front face of the solar cell, so as only slightly to impede the incidence of light on the semiconductor material as a result of the optically opaque, electrically conductive material, usually a metal. For this purpose, the electrically conductive material is deposited on the passivation layer and the electrical contact is subsequently produced by diffusion of the electrically conductive material through the passivation layer as far as the semiconductor material (firing). This results in direct contact between the electrically conductive material and the semiconductor material. The firing is carried out at temperatures in the range of over 560° C. to 600° C.

In some types of solar cell (for example PERC cell, passivated emitter rear contact), the rear face of the solar cell is only contacted locally whilst the remaining lateral portions of the rear face are still provided with a dielectric passivation layer. In some solar cells, the entire rear face is provided with a passivation layer and the electrical contact is implemented by tunnelling charge carriers through this layer (TOPCon cell, tunnel oxide passivated contact). These measures serve to reduce the charge carrier recombination at the contact surface between the electrically conductive material (metal) and the semiconductor material.

To minimise the number and the effect of boundary surface states at the surface of the semiconductor material, the emitter of the solar cell, i.e. of one of the two semiconductor regions, is less heavily doped, but this reduces the electrical conductivity of this region. In a highly doped emitter, the sheet resistance is in the range of 50 to 100Ω (Ω/sq), whereas a lightly doped emitter has a sheet resistance in the range of 100 to 200Ω (Ω/sq). One approach to solving this problem is doping only a small lateral portion of the emitter more heavily, the lateral portion of the emitter being located directly below the electrical contact, in such a way that this portion has a sheet resistance of approximately 60Ω (Ω/sq).

Another approach, described in US 2010/0012179 A1, is to deposit an electrically conductive, optically transparent material, for example a transparent conductive oxide (TCO), on the entire area of the semiconductor material, followed by an antireflection layer, on which a metal is deposited and subsequently fired through the antireflection layer. The structure obtained is characterised in that the semiconductor material on the front face of the solar cell is contacted over the entire area by the electrically conductive, optically transparent material, which in turn is electrically conductively connected to the metal contacts.

However, the firing leads to a heavy thermal stress on the layer stack, which can result in undesirable effects in the semiconductor material as well as degradation of the electrically conductive, optically transparent material, ultimately limiting the improvement in the electrical contacting of the semiconductor material and in the performance of the solar cell again. Further, the firing step involves high costs and a high expenditure of time. Furthermore, problems with the adhesion of the metal to the electrically conductive, optically transparent material are observed, which lead to degradation of the long-term stability and ultimately to failure of the solar cell.

SUMMARY

The invention relates to a monofacial or bifacial crystalline solar cell, on the front face of which over the entire area a first surface passivation layer is arranged directly on the semiconductor interface and above this a first optically opaque, electrically conductive material is arranged in first lateral regions as a front face contact, and a first optically transparent, electrically conductive material is arranged exclusively in second lateral regions. The first optically transparent, electrically conductive material is electrically conductively connected to the front face contact and to a first region of the semiconductor material of the solar cell. The method according to the invention provides applying the first optically transparent, electrically conductive material only after the first optically opaque, electrically conductive material has been applied, in such a way that firing of the front face contact is avoided. Particularly advantageously, the first optically transparent, electrically conductive material is applied as a doped metal oxide by PECVD and in the same system, without interrupting the vacuum, directly before depositing a first antireflection layer on the front face of the solar cell.

DETAILED DESCRIPTION

The object of the present invention is therefore to provide a solar cell and a method for manufacturing a solar cell of this type which reduce the drawbacks of the prior art and in particular make improved performance of the solar cell and a reduction in manufacturing costs possible.

This object is achieved by a crystalline solar cell according to claim 1 and by a method according to claim 11. Advantageous developments and embodiments may be found in the dependent claims.

A crystalline solar cell according to the invention comprises a first region of a semiconductor material having a first doping, a second region of the semiconductor material having a second doping, at least one front face contact made of a first optically opaque, electrically conductive material, which directly or indirectly electrically conductively contacts the first region of the semiconductor material in first lateral regions of the front face of the solar cell, and at least one rear face contact made of a second optically opaque, electrically conductive material, which directly or indirectly electrically conductively contacts the second region of the semiconductor material in first lateral regions of the rear face of the solar cell. Light or electromagnetic radiation arrives in the semiconductor material of the solar cell at least via the front face of the solar cell. The front and rear faces of the solar cell are mutually opposite faces or surfaces of the solar cell. The first doping and the second doping are selected in such a way that there is a pn junction between the first and the second region.

According to the invention, a layer made of a first optically transparent, electrically conductive material is arranged over the first region of the semiconductor material on the front face of the solar cell exclusively in second lateral regions, and is electrically conductively connected to the at least one front face contact. A first surface passivation layer, through which charge carriers can pass, is arranged between the layer made of the first optically transparent, electrically conductive material and the first region of the semiconductor material. The layer made of the first optically transparent, electrically conductive material is thus in indirect, electrically conductive contact with the first region of the semiconductor material. The second lateral regions of the front face of the solar cell are different from the first lateral regions of the front face of the solar cell. The surface passivation layer, which is preferably formed very thin, improves the chemical passivation of the surface of the semiconductor material and/or reduces the number and/or effect of the boundary surface states at the surface of the semiconductor material.

Within the meaning of the application, a direct electrically conductive contact is understood as direct, physical, ohmic contact between two electrically conductive materials or regions. By contrast, indirect electrically conductive contact is understood as a contact in which a further material or a further region, which either is also electrically conductive or is dielectric but configured in such a way that charge carriers can pass through said dielectric material or region, is located between said two electrically conductive materials or regions. In particular, the dielectric material or the dielectric region may be formed so thin that charge carriers can tunnel through it.

Lateral regions of a front or rear face of the solar cell are understood as regions of the solar cell which have a defined extent in the plane of the front or rear face of the solar cell. In the thickness direction of the solar cell, in other words in a direction perpendicularly connecting the front and rear faces, these regions each extend from the front or rear face of the solar cell as far as the associated surface of the semiconductor material. The lateral regions may be of any desired shapes in a plan view of the front or rear face, for example round, polygonal, linear etc.

An optically transparent material is understood as a material which makes it possible for light or electromagnetic radiation, of a wavelength absorbed by the semiconductor material of the solar cell, to pass through, and barely absorbs or reflects it. By contrast, an optically opaque material is understood as a material which absorbs or reflects the light or electromagnetic radiation of a wavelength absorbed by the semiconductor material of the solar cell, and barely allows it to pass through.

The layer made of a first optically transparent, electrically conductive material improves the performance of the solar cell because it collects charge carriers from the first region of the semiconductor material in the second lateral regions of the front face of the solar cell, and dissipates them to the at least one front face contact better than is possible in the art, as a result of the higher electrical conductivity in the lateral direction by comparison with the first region of the semiconductor material.

Preferably, silicon, in particular monocrystalline silicon, is used as the semiconductor material.

Preferably, the first surface passivation layer is also arranged between the at least one front face contact and the first region of the semiconductor material.

In a preferred embodiment, a layer made of an electrically insulating material is arranged over the second region of the semiconductor material in second lateral regions of the rear face of the solar cell, in such a way that the second region of the semiconductor material is electrically insulated in the second lateral regions, in particular from an electrical connecting line which connects the at least one rear face contact to an electrical terminal outside the solar cell. The second lateral regions of the rear face of the solar cell are different from the first lateral regions of the rear face of the solar cell.

In another preferred embodiment, a layer made of a second optically transparent, electrically conductive material is arranged over the first region of the semiconductor material in second lateral regions of the rear face of the solar cell and is electrically conductively connected to the at least one rear face contact. In this case, the layer made of the second optically transparent, electrically conductive material is in direct or indirect electrically conductive contact with the second region of the semiconductor material. The second lateral regions of the rear face of the solar cell are different from the first lateral regions of the rear face of the solar cell.

In the embodiment just described, the second optically transparent, electrically conductive material is preferably also arranged between the second region of the semiconductor material and the rear face contact, in other words also in the first lateral regions of the rear face of the solar cell.

Analogously to what was described for the front face of the solar cell, a second surface passivation layer, through which charge carriers can pass, is preferably arranged between the layer made of the second optically transparent, electrically conductive material and the second region of the semiconductor material and/or between the rear face contact and the second region of the semiconductor material. The advantages described above occur in this context too.

The embodiments in which an optically transparent, electrically conductive material is also arranged on the rear face of the solar cell are particularly advantageous for bifacial solar cells, in which light can radiate into the semiconductor material both from the front face and from the rear face.

Preferably, the first and optionally the second optically transparent, electrically conductive materials are selected from the group consisting of indium-doped tin oxide, fluorine-doped tin oxide, aluminium-doped and/or boron-doped zinc oxide, and antimony-doped tin oxide. The first and optionally the second optically transparent, electrically conductive materials have an electrical conductivity in the range of $2 \cdot 10^3$ to $100 \cdot 10^3$ S/m or a resistivity in the range of $1 \cdot 10^{-4}$ to $50 \cdot 10^{-4}$ Ωcm (surface resistance<10 Ω/sq).

Preferably, the layer made of the first optically transparent, electrically conductive material and/or the layer made of the second optically transparent, electrically conductive material have a thickness in the range of 10 to 100 nm, particularly preferably in the range of 10 to 50 nm. If the layer made of the second optically transparent, electrically conductive material is also arranged between the at least one rear face contact and the semiconductor material, the thickness of this layer can also be reduced in the first lateral regions of the rear face of the solar cell and for example only be greater than or equal to 10% of the thickness of the layer in the second lateral regions of the rear face of the solar cell.

The layer made of the first optically transparent, electrically conductive material and the layer made of the second optically transparent, electrically conductive material may consist of the same or different materials and have the same or different thicknesses.

The first and second optically opaque, electrically conductive materials are preferably selected from the group consisting of aluminium, silver, copper, nickel, vanadium and combinations and alloys thereof, it being possible for these to be the same material or different materials. The first and second optically opaque, electrically conductive materials are distinguished by high electrical conductivity, high long-term stability, and suitability for connection to other assemblies, for example of a solar module.

Preferably, the first and/or second surface passivation layers have a thickness in the range of 1 to 20 nm and consist of a material selected from the group consisting of silicon oxide, silicon nitride, silicon oxynitride and aluminium oxide. The material and/or thickness of the first and second surface passivation layers may be the same as or different from one another.

The first region of the semiconductor material is preferably n-conductively doped and is the emitter of the solar cell, having an electrical sheet resistance in the range of 100 to 200Ω (Ω/sq). In this case, the second region of the semiconductor material is p-doped and forms the bulk of the solar cell.

In another embodiment, the first region of the semiconductor material is n-doped and forms the bulk of the solar cell whilst the second region of the semiconductor material is p-doped and forms the emitter of the solar cell and has an electrical sheet resistance in the range of 120 to 200Ω (Ω/sq). In this embodiment, the arrangement of the second optically transparent, electrically conductive material in the second lateral regions of the rear face of the solar cell or in the first and second lateral regions of the rear face of the solar cell, as described above, is particularly advantageous.

The method according to the invention for manufacturing a crystalline solar cell according to the invention comprises the steps of providing a semiconductor material having a first region and a second region, producing a first surface passivation layer through which charge carriers can pass at or on a first surface of the semiconductor material, applying a first optically opaque, electrically conductive material to the first surface passivation layer in first lateral regions of the first surface of the semiconductor material, and producing at least one direct or indirect electrically conductive contact between the first optically opaque, electrically conductive material and the first region of the semiconductor material in the first lateral regions of the first surface of the semiconductor material, applying a layer made of a first optically transparent, electrically conductive material to the first surface passivation layer in second lateral regions of the first surface of the semiconductor material and applying a second optically opaque, electrically conductive material in first lateral regions of a second surface of the semiconductor material, and producing at least one direct or indirect electrically conductive contact between the second optically opaque, electrically conductive material and the second region of the semiconductor material in the first lateral regions of the second surface of the semiconductor material. The first region and the second region of the semiconductor material are doped in such a way that there is a pn junction between the first region and the second region. The first surface is characterised in that only the first region of the semiconductor material borders on it, and forms the face always pointing towards a light source, in other words the front face, of the solar cell to be manufactured. The second surface is characterised in that only the second region of the semiconductor material borders on it, and forms the face remote from a light source, in other words the rear face, of the solar cell to be manufactured. Thus, the second surface of the semiconductor material is opposite the first surface of the semiconductor material.

During the method, preferably during the step of applying the layer made of the first optically transparent, electrically conductive material, an electrically conductive contact between this layer and the first optically opaque, electrically conductive material and an electrically conductive contact between the layer made of the first optically transparent, electrically conductive material and the first region of the semiconductor material are produced.

According to the invention, the step of applying the first optically transparent, electrically conductive material is carried out after the step of applying the first optically opaque, electrically conductive material, in other words after the material of the at least one front face contact has been deposited. The step of applying a second optically opaque, electrically conductive material to the first lateral regions of a second surface of the semiconductor material and producing the at least one direct or indirect electrically conductive contact between the second optically opaque, electrically conductive material and the second region of the semiconductor material, in other words producing at least one rear face contact, can be carried out before or after or between the steps of depositing and manufacturing the front face contact and applying the layer made of the first optically transparent, electrically conductive material. Preferably, the step of applying a second optically opaque, electrically conductive material is carried out before or between the steps of depositing and producing the front face contact and applying the layer made of the first optically transparent, electrically conductive material.

Optionally, after the first optically opaque, electrically conductive material has been applied, a thermal treatment is carried out. The thermal treatment brings about diffusion of the first optically opaque, electrically conductive material into or through the first surface passivation layer positioned below, and thus produces the direct electrically conductive contact with the first region of the semiconductor material or improves the indirect electrically conductive contact with the first region of the semiconductor material. However, this thermal treatment is carried out at lower temperatures, of approximately 200 to 560° C., than firing. The thermal treatment preferably takes place after the layer made of the first optically transparent, electrically conductive material has been applied, and particularly preferably also after a step of applying an antireflection layer over the layer made of the first optically transparent, electrically conductive material, and can include illuminating the entire layer construction with normal (white) light (for example, from a halogen lamp) at an intensity greater than or equal to 1000 W/m$^2$, for several seconds (≥10 s) to several minutes. Particularly preferably, the thermal treatment only takes place after all the functional layers of the solar cell have been applied, in other words after the first and second optically opaque, electrically conductive material, the first and optionally a second optically transparent, electrically conductive material, optionally an electrically insulating material, and a first and optionally a second antireflection layer have been applied.

In one embodiment of the method, before or after the step of applying the second optically opaque, electrically conductive material in the first lateral regions of the second surface of the semiconductor material, a layer made of an electrically insulating material is applied over the second surface of the semiconductor material in second lateral regions of the second surface of the semiconductor material. The second region of the semiconductor material is thus electrically insulated in the second lateral regions, in such a way that a solar cell having a passivated rear face is produced. The second lateral regions of the second surface of the semiconductor material are different from the first lateral regions of the second surface of the semiconductor material. If the electrically insulating material is applied before the step of applying the second optically opaque, electrically conductive material, the electrically insulating material can be formed on the second surface of the semiconductor material over the entire area. Subsequently, the electrically insulating material is removed from the first lateral regions of the second surface of the semiconductor material again.

In another embodiment of the method, before or after the step of applying the second optically opaque, electrically conductive material in the first lateral regions of the second surface of the semiconductor material, a layer made of a second optically transparent, electrically conductive material is applied in second lateral regions of the second surface of the semiconductor material. In this case, the second lateral regions of the second surface are different from the first lateral regions of the second surface. Finally, an electrically conductive contact is produced between the layer made of the second optically transparent, electrically conductive material and the second optically opaque, electrically conductive material and between the layer made of the second optically transparent, electrically conductive material and the second region of the semiconductor material. In this case, when the rear face contact is produced, the embodiment described for producing the front face contact is possible. In other words, initially the second optically opaque, electrically conductive material can be applied in the first lateral regions of the second surface of the semiconductor material, and subsequently the layer made of the second optically transparent, electrically conductive material can be applied in the second lateral regions of the second surface of the semiconductor material. However, an embodiment is also possible in which initially the layer made of the second optically transparent, electrically conductive material is applied over the second surface of the semiconductor material over the entire area, and subsequently the second optically opaque, electrically conductive material is applied in the first lateral regions of the second surface of the semiconductor material. In this case, the contact of the second optically opaque, electrically conductive material with the second region of the semiconductor material can be produced as was described for manufacturing a solar cell having a passivated rear face.

Preferably, before the step of applying the second optically opaque, electrically conductive material and before the step of applying the layer made of the second optically transparent, electrically conductive material, a second surface passivation layer through which charge carriers can pass is produced at or on the second surface of the semiconductor material.

In a preferred embodiment, a first antireflection layer is applied over the layer made of the first optically transparent, electrically conductive material and/or optionally a second antireflection layer is applied over the layer made of the second optically transparent, electrically conductive material. At least the first antireflection layer is thus applied after the first optically opaque, electrically conductive material has been applied.

Preferably, the layer made of the first optically transparent, electrically conductive material and the first antireflection layer and/or optionally the layer made of the second optically transparent, electrically conductive material and the second antireflection layer are applied in one system without interrupting a vacuum in each case. Thus, the layer made of the first optically transparent, electrically conductive material and the layer made of the second optically transparent, electrically conductive material can be prevented from absorbing moisture while a vacuum is interrupted, and thus the layer in question can be protected from corrosion and the long-term stability of the parameters thereof can be improved.

The layer made of the first optically transparent, electrically conductive material and/or the layer made of the second optically transparent, electrically conductive material are preferably deposited by a PECVD process (plasma-enhanced chemical vapour deposition), in which a plasma is present in a plasma zone. Processes which cause little damage to the surface of the semiconductor material are particularly preferred. For example, plasma processes in which the plasma is excited using microwaves and/or in which the plasma zone is spatially set back from the relevant surface to be coated of the semiconductor material are processes of this type. This makes very gentle deposition of the optically transparent, electrically conductive material possible, without the relevant surface of the semiconductor material being damaged by the incidence of high-energy ions. Further, depositing these layers by a PECVD process has the advantage that the relevant optically transparent, electrically conductive material and the relevant antireflection layer develop poorly (selective process) on the relevant optically opaque, electrically conductive material. The optically transparent, electrically conductive material which forms the at least one front face contact or the at least one rear face contact of the manufactured solar cell can thus be electrically contacted directly from the outside, in a simple manner and without complicated removal of overlaid layers. Preferably, the surface (101*a*, 102*a*) to be coated of the semiconductor material (10) is moved past the plasma zone linearly during the deposition process.

Preferably, the first and/or second optically transparent, electrically conductive materials are a zinc oxide, which is particularly preferably doped with aluminium or boron. The preferred deposition method for this material is a microwave-assisted PECVD process using the starting substances of diethyl zinc (DEtZ or DEZ) or dimethyl zinc (DMZ) as a zinc supplier, dinitrogen monoxide (N$_2$O, laughing gas) and/or oxygen (O$_2$) as an oxygen supplier as well as an inert gas (argon, neon or helium) and/or nitrogen. Further, for depositing an aluminium-doped zinc oxide, trimethylaluminium (TMAI or TMA) is preferably added as an aluminium source, and for depositing a boron-doped zinc oxide, diborane (B$_2$H$_6$) is preferably added as a boron source.

Hereinafter, the invention is to be clarified by way of embodiments and drawings, like elements, layers or regions being labelled with like reference numerals, but size and thickness ratios not being shown to scale.

DETAILED DESCRIPTION OF THE PREFERRED EMBODIMENTS

Figure 1:
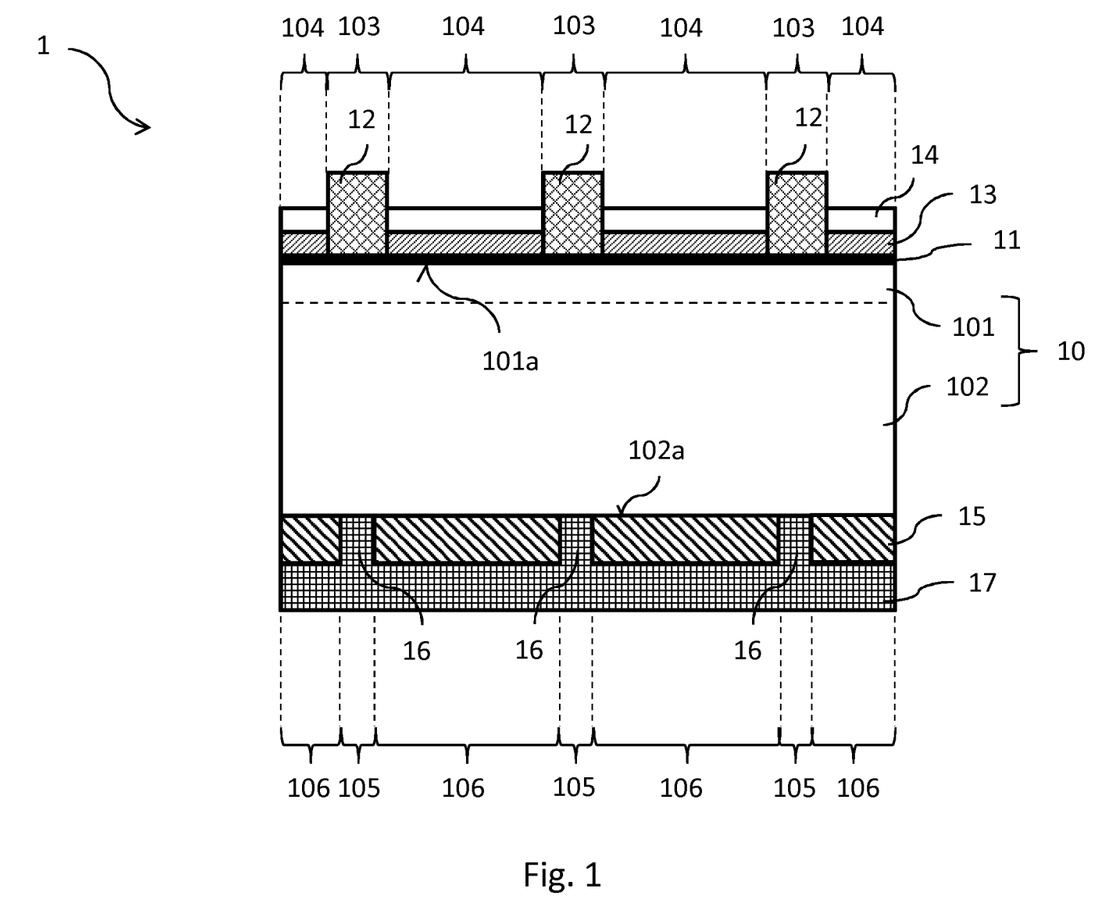
FIG. 1 shows a first embodiment of the solar cell (1) according to the invention comprising a passivated rear face.

FIG. 1 is a cross section of a first embodiment of the crystalline solar cell (1) according to the invention. The solar cell (1) has a monocrystalline semiconductor material (10), for example consisting of silicon, in which a first region (101) and a second region (102) are formed which each have a doping such that there is a pn junction between the first region (101) and the second region (102). In the present case, the first region (101) is n-doped, has a sheet resistance in the range of 100 to 200Ω (Ω/sq), and serves as the emitter of the solar cell (1), whilst the second region (102) is p-doped. The semiconductor material (10) has a first surface (101a), which is only bordered by the first region (101) of the semiconductor material (10) and which is the front face (face pointing towards the light) of the solar cell (1), and a second surface (102a), which is only bordered by the second region (102) of the semiconductor material (10) and which is the rear face (face remote from the light) of the solar cell (1). The first surface (101a) is opposite the second surface (102a). The first surface (101a) may have a texture, in other words a surface structure, in accordance with the prior art, which improves the admission of the light into the semiconductor material (10). This texture is not shown in FIG. 1. The first region (101) of the semiconductor material has been produced by introducing n-doped dopants, for example phosphorus (P), arsenic (As) or antimony (Sb), into the semiconductor material, for example by diffusion or ion implantation.

A first surface passivation layer (11), for example made of SiO$_2$ or SiON, is arranged at or on the first surface (101a) of the semiconductor material (10). The first surface passivation layer (11) may be deposited on the first surface (101a) or be produced by converting the semiconductor material (10), for example by oxidation. In the embodiment shown in FIG. 1, the surface passivation layer (11) covers the first surface (101a) of the semiconductor material over the entire lateral extent of the first surface (101a). The lateral extent is the extent in a plane perpendicular to the cross-sectional plane shown.

At least one front face contact (12), in the case shown three front face contacts (12), made of a first optically opaque, electrically conductive material, for example Ag, are arranged on the front face of the solar cell (1) in first lateral regions (103) of the front face. The first surface passivation layer (11) is positioned between the front face contact (12) and the first surface (101a) of the semiconductor material (10), in such a way that there is indirect electrically conductive contact between the front face contact (12) and the first region (101) of the semiconductor material (10). The first lateral regions (103) may be of any desired shape in a plan view of the front face of the solar cell (1), in other words in a plane perpendicular to the cross-sectional plane shown. In particular, the lateral regions (103) may be rectangular strips extending in a straight line or winding strips which extend into the plane of the drawing or circular, elliptical, triangular or polygonal or freely shaped areas. The first lateral regions (103) may be arranged regularly or irregularly distributed over the entire front face of the solar cell (1). The thickness of the first optically opaque, electrically conductive material of the front face contact (12) is in the range between 5 and 25 μm.

In second lateral regions (104) of the front face of the solar cell (1), a layer (13) of a first optically transparent, electrically conductive material, for example AlZnO (aluminium-doped zinc oxide), is arranged over the first surface passivation layer (11) and the first surface (101a) of the semiconductor material (10). There is therefore an indirect, electrically conductive contact between the layer (13) made of the first optically transparent, electrically conductive material and the first region (101) of the semiconductor material (10). The second lateral regions (104) border on the first lateral regions (103) of the front face of the solar cell (1) and together with them span the entire front face of the solar cell (1). Thus, in the plan view of the front face of the solar cell (1), the second lateral regions (104) are of a shape complementary to the shape of the first lateral regions (103). The proportion of the first lateral regions (103) out of the total area of the front face of the solar cell (1) in the plan view is in the range of 1.5 to 3.0%.

The layer (13) made of the first optically transparent, electrically conductive material has a thickness in the range of 10 to 50 nm, preferably of 30 nm, and is in direct electrical contact with the front face contact (12).

At a thickness of 1 to 2 nm, the first surface passivation layer (11) is so thin that charge carriers can pass through it between the first region (101) of the semiconductor material (10) and the front face contact (12) or the layer (13) made of the first optically transparent, electrically conductive material.

A first antireflection layer (14), which consists of silicon nitride (SiN) and has a thickness of 50 to 100 nm, is further arranged in the second lateral regions (104) of the front face of the solar cell (1). This first antireflection layer (14)

reduces the reflection of the light incident on the solar cell (1) and improves the admission of the light into the solar cell (1).

In this and all the other embodiments, it is characteristic of the solar cell (1) according to the invention that the layer (13) made of the first optically transparent, electrically conductive material, and preferably also the first antireflection layer (14), is formed on the front face exclusively in the second lateral regions (104) and is not present in the first lateral regions (103). The electrical contact of the front face contact(s) (12) with the semiconductor material and the adhesion of the front face contact(s) (12) are thus greatly improved in comparison with a construction in which there is a region of an electrically poorly conductive material, such as a transparent, electrically conductive oxide, between the front face contact and the semiconductor material.

On the rear face of the solar cell (1), at least one rear face contact (16), in the case shown three rear face contacts (16), made of a second optically opaque, electrically conductive material, for example Al, is arranged in first lateral regions (105) of the rear face. The rear face contacts (16) border directly on the second surface (102a) of the semiconductor material (10), in such a way that there is a direct, electrically conductive contact between the rear face contact (16) and the second region (102) of the semiconductor material (10). The first lateral regions (105) of the rear face may, as described previously for the first lateral regions (103) of the front face, be of any desired shape in a plan view of the rear face of the solar cell (1) and be arranged distributed as desired over the entire rear face.

In second lateral regions (106) of the rear face of the solar cell (1), a 5 to 200 nm thick dielectric layer (15) is arranged on the second surface (102a) of the semiconductor material (10). The dielectric layer (15) consists for example of aluminium oxide, silicon oxide, silicon nitride or silicon oxynitride, or other materials suitable for passivation and electrically insulating p-type Si surfaces or a sequence of layers made of various of these materials. It electrically insulates the second surface (102a) of the semiconductor material (10) from a rear face connection (17) which interconnects the individual local rear face contacts (16). The rear face connection (17) may consist of the same material as the rear face contacts (16) and be applied together therewith. By way of example, the dielectric layer (15) consists of a 20 nm thin aluminium oxide layer (AlOx) and a 140 nm thick silicon nitride layer. The total thickness of the second optically opaque, electrically conductive material of the rear face contact (16) and the rear face connection (17) is in the range between 3 and 30 µm, preferably being 20 µm.

The second lateral regions (106) border on the first lateral regions (105) of the rear face of the solar cell (1) and together with them span the entire rear face of the solar cell (1). Thus, in the plan view of the rear face of the solar cell (1), the second lateral regions (106) are of a shape complementary to the shape of the first lateral regions (105). The proportion of the first lateral regions (105) out of the total area of the rear face of the solar cell (1) in the plan view is in the range of 1 to 5%. The shape and/or dimensions and/or lateral distribution and/or proportion of the first lateral regions (105) on the rear face of the solar cell (1) may be the same as or different from the shape and/or dimensions and/or lateral distribution and/or proportion of the first lateral regions (103) on the front face of the solar cell (1) and be arranged distributed over the lateral extent of the rear face of the solar cell (1) independently of these.

Figure 2:
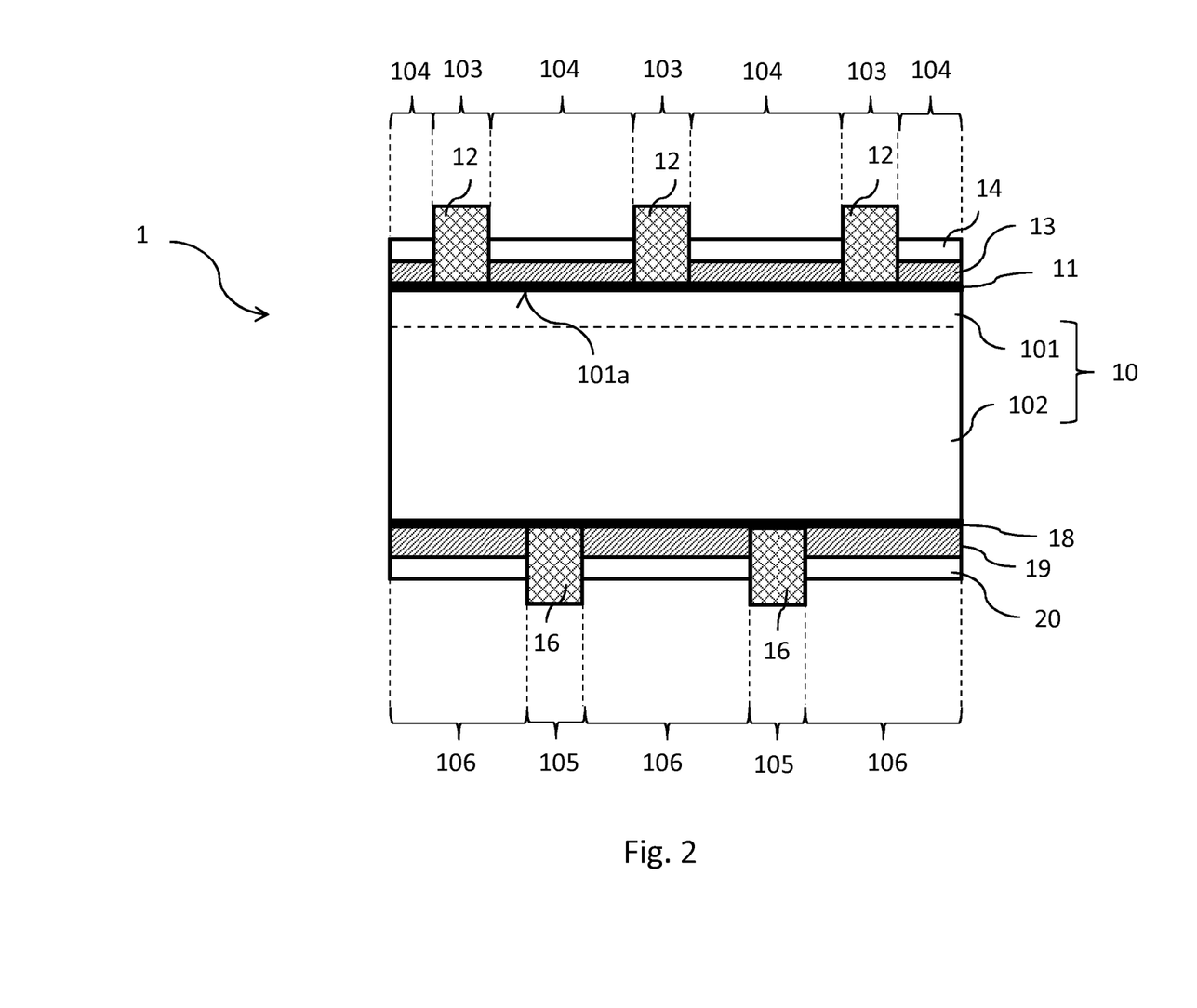
FIG. 2 shows a second embodiment of the solar cell (1) according to the invention, comprising a layer (19) made of a second optically transparent, electrically conductive material on the rear face, the layer (19) made of the second optically transparent, electrically conductive material only being arranged in second lateral regions (106) on the rear face.

The second embodiment of the crystalline solar cell (1) according to the invention, shown in FIG. 2, differs from the first embodiment in that the solar cell (1) is a bifacial solar cell, the rear face of which is formed virtually identically to the front face. In particular, instead of the dielectric layer, the rear face has a second surface passivation layer (18) and a layer (19) made of a second optically transparent, electrically conductive material in the second lateral regions (106).

The second surface passivation layer (18), for example made of aluminium oxide or silicon oxide, is arranged at or on the second surface (102a) of the semiconductor material (10). The second surface passivation layer (18) may be deposited on the second surface (102a) or be produced by converting the semiconductor material (10), for example by oxidation. In the embodiment shown in FIG. 2, the second surface passivation layer (18) covers the second surface (102a) of the semiconductor material over the entire lateral extent of the second surface (102a).

As explained previously for FIG. 1, on the rear face of the solar cell (1), at least one rear face contact (16), in the case shown two rear face contacts (16), made of a second optically opaque, electrically conductive material, for example Al, is arranged in first lateral regions (105) of the rear face. The second surface passivation layer (18) is arranged between the rear face contact (16) and the second surface (102a) of the semiconductor material (10), in such a way that there is an indirect electrically conductive contact between the rear face contact (16) and the second region (102) of the semiconductor material (10).

The layer (19) made of the second optically transparent, electrically conductive material, for example ZnO (nitrogen-doped zinc oxide) or ITO (indium-doped tin oxide) is arranged in the second lateral regions (106) of the rear face of the solar cell (1). The layer (19) made of the second optically transparent, electrically conductive material is in electrically conductive contact with the rear face contact (16) and also, via the second surface passivation layer (18), with the second region (102) of the semiconductor material (10).

The second surface passivation layer (18) in turn has a thickness in the range of 1 to 2 nm, in such a way that charge carriers can pass through it between the second region (102) of the semiconductor material (10) and the layer (19) made of the second optically transparent, electrically conductive material. The layer (19) made of the second optically transparent, electrically conductive material is formed in the second lateral regions (106) at a thickness in the range of 10 to 50 nm. The thickness of the second optically opaque, electrically conductive material of the rear face contact (16) is in the range between 3 and 30 µm, preferably being 20 µm.

A second antireflection layer (20), which consists of silicon nitride or silicon oxynitride and has a thickness of 50 to 100 nm, is further arranged in the second lateral regions (106) of the rear face of the solar cell (1). The material and/or thickness of the second antireflection layer (20) may be the same as or different from the material and/or thickness of the first antireflection layer (14). The second antireflection layer (20) reduces the reflection of the light incident on the rear face of the solar cell (1) and improves the admission of the light from the rear face into the solar cell (1).

Figure 3:
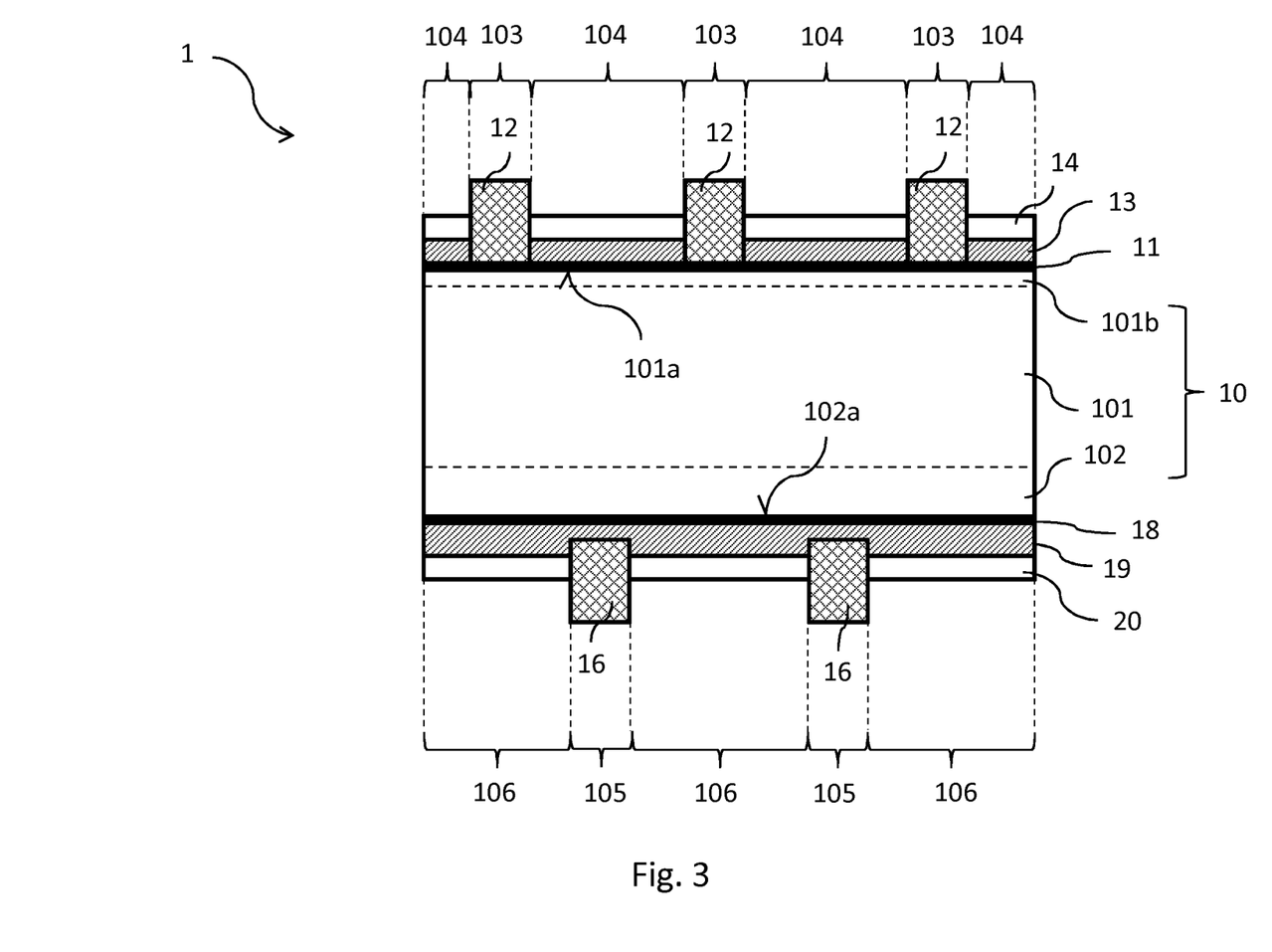
FIG. 3 shows a third embodiment of the solar cell (1) according to the invention, comprising a layer (19) made of a second optically transparent, electrically conductive material on the rear face, the layer (19) made of the second optically transparent, electrically conductive material also being arranged in first lateral regions (105) of the rear face.

FIG. 3 is a cross section of a third embodiment of the solar cell (1). In this case, the first region (101) of the semiconductor material (10) is n-doped and has a sub-region (101b) bordering on the first surface (101a) and having an increased doping of the same doping type as the rest of the first region (101). By contrast, the second region (102) is p-doped, has a sheet resistance in the range of 120 to 200Ω (Ω/sq), and serves as the emitter of the solar cell (n-PERL BJ). In this case too, the first surface (101a) may have a texture, in other words a surface structure, which improves the admission of the light into the semiconductor material (10), this texture not being shown in FIG. 3. For a total thickness of the semiconductor material (10) greater than or equal to 10 μm, the sub-region (101b) of the first region (101) has a thickness of 300 nm for example and the second region (102) has a thickness of 600 nm.

On the front face of the solar cell (1), at least one front face contact (12) is arranged in first lateral regions (103) of the front face of the solar cell (1) and a layer (13) made of a first optically transparent, electrically conductive material and a first antireflection layer (14) are arranged as described for FIG. 1.

As described for FIG. 2, a second surface passivation layer (18), at least one rear face contact (16), a layer (19) made of a second optically transparent, electrically conductive material and a second antireflection layer (20) are arranged at or on the second surface (102a) of the semiconductor material (10). The sole difference between the rear faces of the solar cell (1) in the embodiment shown in FIG. 3 and the embodiment shown in FIG. 2 is that the layer (19) made of a second optically transparent, electrically conductive material is present not only in the second lateral regions (106) of the rear face of the solar cell (1) but also in the first lateral regions (105) of the rear face of the solar cell (1). The second surface passivation layer (18) and the layer (19) made of the second optically transparent, electrically conductive material are thus arranged between the rear face contact (16) and the second surface (102a) of the semiconductor material (10).

In the embodiment shown in FIG. 3, the layer (19) made of the second optically transparent, electrically conductive material is present at a lower thickness in the first lateral regions (105) than in the second lateral regions (106), but it may also be of the same thickness.

An embodiment of the method according to the invention for manufacturing a solar cell according to the invention will now be described by way of FIGS. 4A to 4D. Each drawing is a cross section through the solar cell after the completion of a different method step.

Figure 4A:
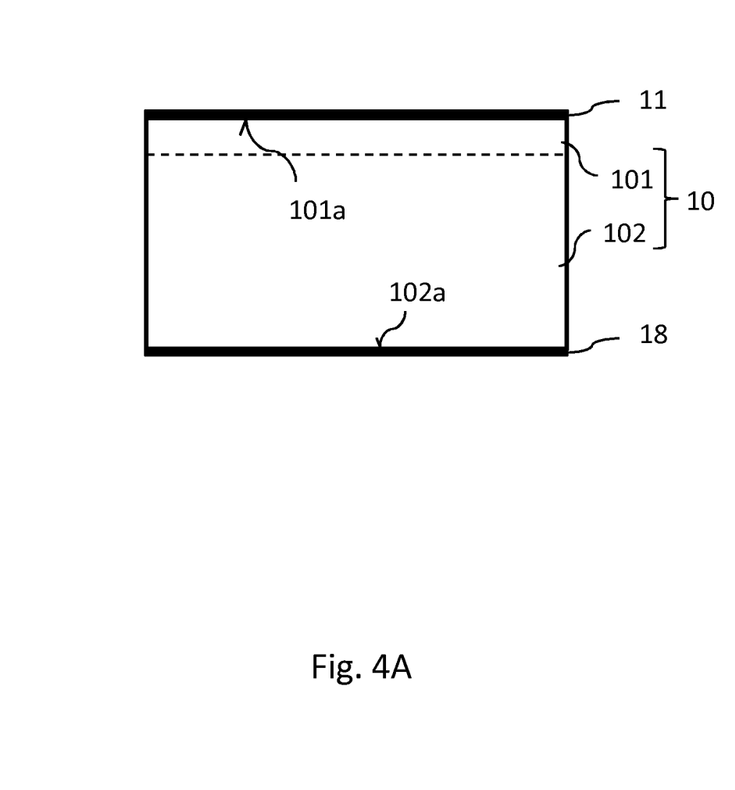
FIGS. 4A to 4D show an exemplary embodiment of the method according to the invention by way of cross sections through the solar cell in different method stages.

FIG. 4A shows a semiconductor material (10) in which the first region (101) and the second region (102) are present. Optionally formed surface textures are not shown in FIGS. 4A to 4D. A first surface passivation layer (11) has been produced on the first surface (101a) of the semiconductor material (10) over the entire area, and a second surface passivation layer (18) has been produced on the second surface (102a) of the semiconductor material (10) over the entire area. These layers consist of silicon oxide and are of a thickness of 1 to 2 nm. They have been produced by rapid thermal oxidation, wet chemical oxidation, or UV-assisted and ozone-assisted dry oxidation (SQi).

Figure 4B:
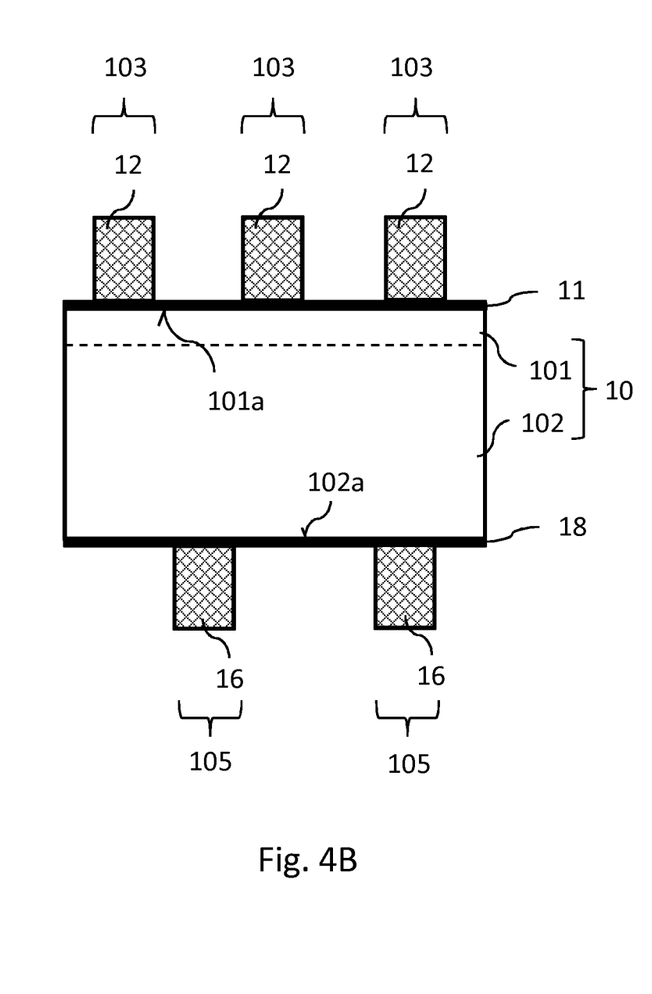

In the following method step, front face contacts (12) made of a first optically opaque, electrically conductive material are produced on the first surface (101a), and rear face contacts (16) made of a second optically opaque, electrically conductive material are produced on the second surface (102a) of the semiconductor material (10). The front and rear face contacts (12, 16) are applied to the first lateral regions (103, 105) of the respective surface (101a, 102a) by screen printing, and consist for example of a silver paste. The result of this method step is shown in FIG. 4B.

Figure 4C:
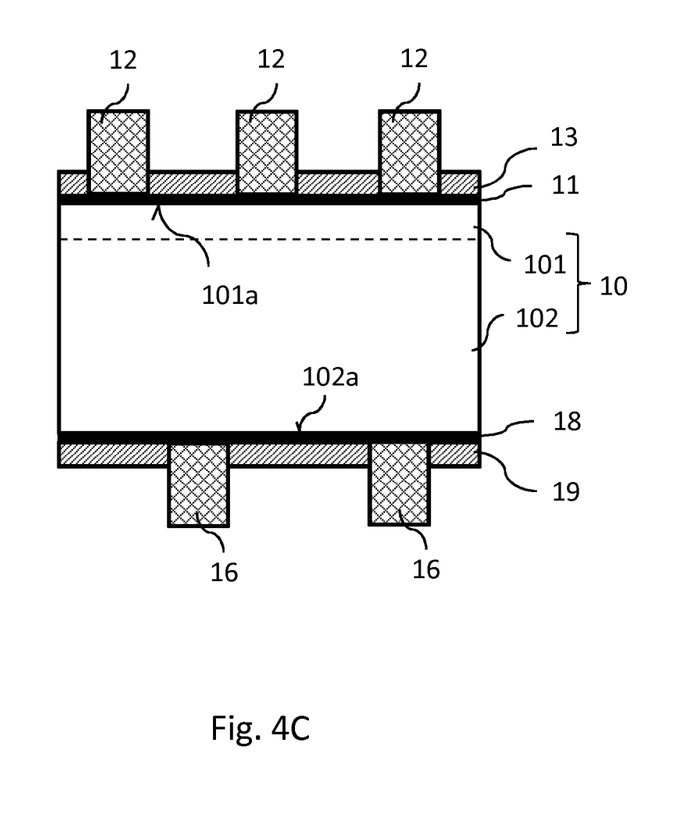

Subsequently, a layer (13) made of a first optically transparent, electrically conductive material is applied to the exposed regions of the first surface passivation layer (11), in other words between the front face contacts (12) made of the first optically opaque, electrically conductive material, and a layer (19) made of a second optically transparent, electrically conductive material is applied to the exposed regions of the second surface passivation layer (18), in other words between the rear face contacts (16) made of the second optically opaque, electrically conductive material, as is shown in FIG. 4C. The first optically transparent, electrically conductive material and the second optically transparent, electrically conductive material are aluminium-doped or boron-doped zinc oxide, having a thickness of approximately 30 nm in each case. The doping corresponds to the conduction type of the semiconductor region (101, 102) bordering the surface passivation layer (11, 18) in question.

Figure 4D:
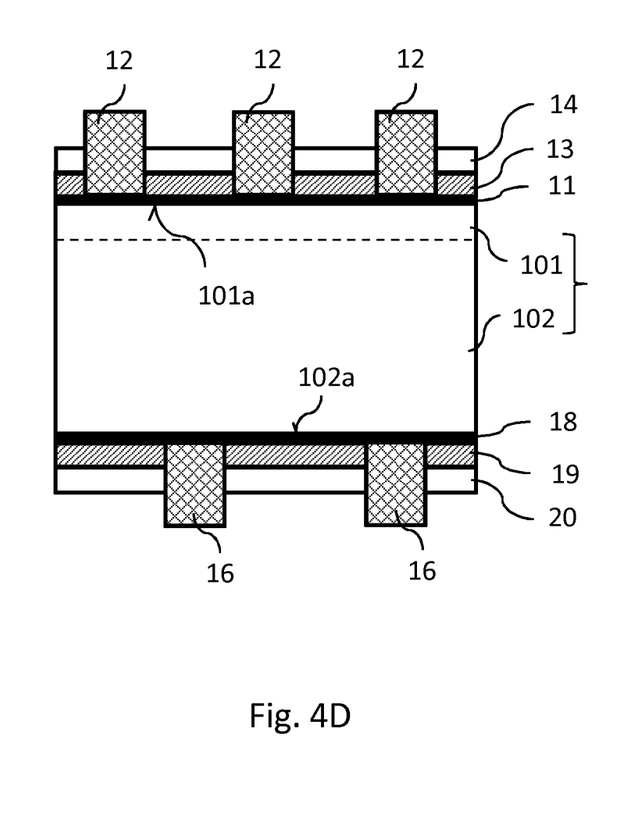

FIG. 4D shows the solar cell after a method step in which a first antireflection layer (14) has been produced on the layer (13) made of the first optically transparent, electrically conductive material and a second antireflection layer (20) has been produced on the layer (19) made of the second optically transparent, electrically conductive material. The first antireflection layer (14) and the second antireflection layer (20) consist of silicon nitride and each have a thickness of approximately 60 nm.

The layer (13) made of the first optically transparent, electrically conductive material, the layer (19) made of the second optically transparent, electrically conductive material, and the first antireflection layer (14) and the second antireflection layer (20) have been produced in the same coating system in the stated order. However, different coating systems and other orders of the layer depositions are possible, so long as the desired construction of the solar cell is implemented.

In a final step, the construction of FIG. 4D is subjected to a thermal treatment. The solar cell is exposed to a temperature of 200° C. to 300° C. for approximately 1 min. (a minute). In addition, illumination may be carried out using white light having an intensity of at least 1000 W/m², making it possible to improve the parameters of the solar cell. However, the construction of the solar cell is not structurally altered by the thermal step. Only the first and/or the second optically opaque, electrically conductive material can diffuse into or through the associated first and/or second surface passivation layer (11 and/or 18). As a result, a solar cell as shown in FIG. 2 is obtained without it being necessary to fire the contacts.

Table 1 shows example process parameters for a PECVD deposition of the layer made of the first and/or second optically transparent, electrically conductive material consisting of aluminium-doped or boron-doped zinc oxide. These relate to a PECVD system having a remote microwave plasma, in which the plasma chamber is spatially set back from, in other words separated from, the surface to be coated of a substrate. The damage to the surface to be coated from ion bombardment from the plasma is thus reduced.

TABLE 1

| Parameter | Range | Preferred value |
| --- | --- | --- |
| Process pressure (chamber pressure) | 0.1-0.2 mbar (10-20 Pa) | 0.15 mbar (15 Pa) |
| Process temperature (substrate temperature) | 100-400° C. | 250° C. |
| Microwave plasma power | 300-1000 W | 600 W |
| Microwave peak | 2000-3000 W | 2500 W |
| Pulse duration and frequency of MW power | T = 16-32 ms; f = 31-62 Hz ($t_{ON}$ = 4-6 ms, $t_{OFF}$ = 12-26 ms) | T = 22 ms; f = 45 Hz ($t_{ON}$ = 5 ms, $t_{OFF}$ = 17 ms) |
| $N_2O$/DEZ gas flow | 10-20 | 15 |

TABLE 1-continued

| Parameter | Range | Preferred value |
|---|---|---|
| ratio | | |
| O$_2$/DEZ gas flow ratio | 7-15 | 10 |
| DEZ gas flow* | 100 sccm = 550 mgm | |
| N$_2$O gas flow* | 1500 sccm | |
| O$_2$ gas flow* | 1000 sccm | |
| Ar gas flow* | 400 sccm | |
| TMAI gas flow | 10 mgm | Premixed at 2% in DEZ |
| B$_2$H$_6$ gas flow | 200 sccm | 1% in H$_2$ |
| Doping agent concentration | 1-5% | 2% |

*per plasma source

Some or all of the stated embodiments of the solar cell or of the method for manufacturing a solar cell may also be combined with one another, so long as they are not mutually exclusive.

LIST OF REFERENCE NUMERALS

1 Solar cell
10 Semiconductor material
101 First region of the semiconductor material
101a First surface of the semiconductor material
101b Sub-region of the first region
102 Second region of the semiconductor material
102a Second surface of the semiconductor material
103 First lateral region of the front face
104 Second lateral region of the front face
105 First lateral region of the rear face
106 Second lateral region of the rear face
11 First surface passivation layer
12 Front face contact
13 Layer made of first optically transparent, electrically conductive material
14 First antireflection layer
15 Dielectric layer
16 Rear face contact
17 Rear face connection
18 Second surface passivation layer
19 Layer made of second optically transparent, electrically conductive material
20 Second antireflection layer

The invention claimed is:

1. A crystalline solar cell, comprising:
a first region of a semiconductor material having a first doping, a second region of the semiconductor material having a second doping, in such a way that there is a pn junction between the first and second regions, at least one front face contact made of a first optically opaque, electrically conductive material, which directly or indirectly electrically conductively contacts the first region of the semiconductor material in first lateral regions of the front face of the solar cell, and at least one local rear face contact made of a second optically opaque, electrically conductive material, which directly or indirectly electrically conductively contacts the second region of the semiconductor material in first lateral regions of the rear face of the solar cell, characterised in that a layer made of a first optically transparent, electrically conductive material is arranged over the first region of the semiconductor material on the front face of the solar cell exclusively in second lateral regions, and is electrically conductively connected to the at least one front face contact, a first surface passivation layer, through which charge carriers can pass, being arranged between the at least one front face contact and the first region of the semiconductor material, and between the layer made of the first optically transparent, electrically conductive material and the first region of the semiconductor material, in such a way that the layer made of the first optically transparent, electrically conductive material is in indirect, electrically conductive contact with the first region of the semiconductor material, and the second lateral regions of the front face of the solar cell being different from the first lateral regions of the front face of the solar cell, wherein the first optically transparent, electrically conductive material is configured to collect charge carriers that pass through the first surface passivation layer from the first region of the semiconductor material in the second lateral regions and dissipate them to the first optically opaque, electrically conductive material.

2. The crystalline solar cell according to claim 1, characterised in that a layer made of an electrically insulating material is arranged over the second region of the semiconductor material in second lateral regions of the rear face of the solar cell, in such a way that the second region of the semiconductor material is electrically insulated in the second lateral regions, the second lateral regions of the rear face of the solar cell being different from the first lateral regions of the rear face of the solar cell.

3. The crystalline solar cell according to claim 1, characterised in that a layer made of a second optically transparent, electrically conductive material is arranged over the second region of the semiconductor material in second lateral regions of the rear face of the solar cell and is electrically conductively connected to the at least one rear face contact, the layer made of the second optically transparent, electrically conductive material being in direct or indirect electrically conductive contact with the second region of the semiconductor material and the second lateral regions of the rear face of the solar cell being different from the first lateral regions of the rear face of the solar cell.

4. The crystalline solar cell according to claim 3, characterised in that the second optically transparent, electrically conductive material is also arranged between the second region of the semiconductor material and the rear face contact.

5. The crystalline solar cell according to claim 3, characterised in that a second surface passivation layer, through which charge carriers can pass, is arranged between the layer made of the second optically transparent, electrically conductive material and the second region of the semiconductor material and/or between the rear face contact and the second region of the semiconductor material.

6. The crystalline solar cell according to claim 1, characterised in that the first and/or the second optically transparent, electrically conductive materials are selected from the group consisting of indium-doped tin oxide, fluorine-doped tin oxide, antimony-doped tin oxide, aluminium-doped zinc oxide and boron-doped zinc oxide.

7. The crystalline solar cell according to claim 1, characterised in that the layer made of the first optically transparent, electrically conductive material and/or the layer made of the second optically transparent, electrically conductive material have a thickness in the range of 10 to 100 nm.

8. The crystalline solar cell according to claim 1, characterised in that the first and second optically opaque, electrically conductive materials are selected from the group consisting of aluminium, silver, copper, nickel, vanadium and combinations and alloys thereof.

9. The crystalline solar cell according to claim 1, characterised in that the first and/or second surface passivation layers have a thickness in the range of 1 to 20 nm and consist of a material selected from the group consisting of silicon oxide, silicon nitride, silicon oxynitride and aluminium oxide.

10. A method of manufacturing a crystalline solar cell, comprising:
providing a semiconductor material having a first region and a second region the first region and the second region being doped in such a way that there is a pn junction between the first region and the second region;
producing a first surface passivation layer on a first surface of the semiconductor material, the first surface passivation layer being configured such that charge carriers from the first region of the semiconductor material pass through the first surface passivation layer, and only the first region of the semiconductor material bordering on the first surface;
applying a first optically opaque, electrically conductive material to the first surface passivation layer in first lateral regions of the first surface of the semiconductor material such that the first surface passivation layer is positioned between the first optically opaque, electrically conductive material and the first region of the semiconductor material, to produce at least one direct or indirect electrically conductive contact between the first optically opaque, electrically conductive material and the first region of the semiconductor material in the first lateral regions of the first surface of the semiconductor material;
applying a layer of a first optically transparent, electrically conductive material to the first surface passivation layer in second lateral regions of the first surface of the semiconductor material after the first optically opaque, electrically conductive material has been applied, electrically conductive contact between the layer made of the first optically transparent, electrically conductive material and the first optically opaque, electrically conductive material and also electrically conductive contact between the layer made of the first optically transparent, electrically conductive material and the first region of the semiconductor material being produced, the second lateral regions being different from the first lateral regions, and the first optically transparent, electrically conductive material being configured to collect charge carriers that pass through the first surface passivation layer from the first region of the semiconductor material in the second lateral regions and dissipate them to the first optically opaque, electrically conductive material of the at least one electrically conductive contact; and
applying a second optically opaque, electrically conductive material in first lateral regions of a second surface of the semiconductor material, and producing at least one direct or indirect electrically conductive contact between the second optically opaque, electrically conductive material and the second region of the semiconductor material in the first lateral regions of the second surface of the semiconductor material, only the second region of the semiconductor material bordering on the second surface, and the second surface of the semiconductor material being opposite the first surface of the semiconductor material,
wherein a thermal treatment step at a temperature in the range of 200° C. to 560° C. is performed after applying the layer of the first optically transparent, electrically conductive material to the first surface passivation layer in the second lateral regions of the first surface of the semiconductor material.

11. The method according to claim 10, characterised in that, before or after the step of applying the second optically opaque, electrically conductive material in the first lateral regions of the second surface of the semiconductor material a layer made of an electrically insulating material is applied over the second surface of the semiconductor material in second lateral regions of the second surface of the semiconductor material, in such a way that the second region of the semiconductor material is electrically insulated in the second lateral regions, the second lateral regions of the second surface of the semiconductor material being different from the first lateral regions of the second surface of the semiconductor material.

12. The method according to claim 10, characterised in that, before or after the step of applying the second optically opaque, electrically conductive material in the first lateral regions of the second surface of the semiconductor material, a layer made of a second optically transparent, electrically conductive material is applied over the second surface of the semiconductor material in second lateral regions of the second surface of the semiconductor material, an electrically conductive contact being produced between the layer made of the second optically transparent, electrically conductive material and the second optically opaque, electrically conductive material, and an electrically conductive contact being produced between the layer made of the second optically transparent, electrically conductive material and the second region of the semiconductor material, the second lateral regions of the second surface being different from the first lateral regions of the second surface.

13. The method according to claim 12, characterised in that, before the step of applying the second optically opaque, electrically conductive material in first lateral regions of the second surface of the semiconductor material and before the step of applying the layer made of the second optically transparent, electrically conductive material, a second surface passivation layer through which charge carriers can pass is produced at or on the second surface of the semiconductor material.

14. The method according to claim 12, characterised in that a first antireflection layer is applied over the layer made of the first optically transparent, electrically conductive material and/or a second antireflection layer is applied over the layer made of the second optically transparent, electrically conductive material.

15. The method according to claim 14, characterised in that the layer made of the first optically transparent, electrically conductive material and the first antireflection layer and/or the layer made of the second optically transparent, electrically conductive material and the second antireflection layer are applied in one system without interrupting a vacuum.

16. The method according to claim 10, characterised in that the layer made of the first optically transparent, electrically conductive material and/or the layer made of the second optically transparent, electrically conductive material are deposited by a PECVD process, in which a plasma is present in a plasma zone.

17. The method according to claim 16, characterised in that energy is introduced into the plasma by microwaves during the PECVD process.

18. The method according to claim 16, characterised in that the PECVD process used for depositing the layer made of the first optically transparent, electrically conductive material and/or the layer made of the second optically transparent, electrically conductive material is a PECVD process, in which the plasma zone is spatially set back from a relevant surface to be coated of the semiconductor material.

19. The method according to claim 16, characterised in that a surface to be coated of the semiconductor material is moved past the plasma zone linearly.

20. The method according to claim 17, characterised in that the first and/or second optically transparent, electrically conductive materials are a zinc oxide, and the PECVD process is carried out using starting substances of dimethyl zinc or diethyl zinc as a zinc supplier, dinitrogen monoxide and/or oxygen as an oxygen supplier, and an inert gas and/or nitrogen.

21. The method according to claim 20, characterised in that the PECVD process further uses trimethylaluminium as an aluminium source for applying the zinc oxide as an aluminium-doped zinc oxide or diborane as a boron source for applying the zinc oxide as a boron-doped zinc oxide during the PECVD process.

22. The method according to claim 10, characterized in that a proportion of the first lateral regions out of a total area of a front face of the crystalline solar cell in a plan view is in the range of 1.5% to 3.0%.

23. The method according to claim 10, characterised in that the thermal treatment step includes illuminating the entire layer construction with normal (white) light at an intensity greater than or equal to 1000 W/m$^2$ for a time in the range of several seconds to several minutes.

24. The method according to claim 14, characterised in that the thermal treatment step is performed after applying the first antireflection layer and/or the second antireflection layer.

25. A method of Method for manufacturing a crystalline solar cell, comprising:
providing a semiconductor material having a first region and a second region the first region and the second region being doped in such a way that there is a pn junction between the first region and the second region;
producing a first surface passivation layer on a first surface of the semiconductor material that is configured such that charge carriers from the first region of the semiconductor material pass therethrough, only the first region of the semiconductor material bordering on the first surface;
applying a first optically opaque, electrically conductive material over the first surface passivation layer in first lateral regions of the first surface of the semiconductor material to produce at least one direct or indirect electrically conductive contact between the first optically opaque, electrically conductive material and the first region of the semiconductor material in the first lateral regions of the first surface of the semiconductor material;
selectively applying a layer of a first optically transparent, electrically conductive material over the first surface passivation layer only in second lateral regions of the first surface of the semiconductor material after the first optically opaque, electrically conductive material has been applied, electrically conductive contact between the layer made of the first optically transparent, electrically conductive material and the first optically opaque, electrically conductive material and also electrically conductive contact between the layer made of the first optically transparent, electrically conductive material and the first region of the semiconductor material being produced, the second lateral regions being different from the first lateral regions, wherein the first optically transparent, electrically conductive material is configured to collect charge carriers that pass through the first surface passivation layer from the first region of the semiconductor material in the second lateral regions and dissipate them to the first optically opaque, electrically conductive material of the at least one electrically conductive contact, and wherein the layer of the first optically transparent, electrically conductive material is applied using a PECVD method with a remote microwave plasma and a temperature in the range of 100° C. to 400° C.; and
applying a second optically opaque, electrically conductive material in first lateral regions of a second surface of the semiconductor material, and producing at least one direct or indirect electrically conductive contact between the second optically opaque, electrically conductive material and the second region of the semiconductor material in the first lateral regions of the second surface of the semiconductor material, only the second region of the semiconductor material bordering on the second surface, and the second surface of the semiconductor material being opposite the first surface of the semiconductor material,
wherein a thermal treatment step at a temperature in the range of 200° C. to 560° C. is performed after applying the layer of the first optically transparent, electrically conductive material to the first surface passivation layer in second lateral regions of the first surface of the semiconductor material.

26. The method according to claim 10, wherein applying the layer of the first optically transparent, electrically conductive material to the first surface passivation layer comprises forming the layer of the first optically transparent, electrically conductive material only in the second lateral regions.

* * * * *

UNITED STATES PATENT AND TRADEMARK OFFICE
CERTIFICATE OF CORRECTION

PATENT NO. : 11,444,211 B2
APPLICATION NO. : 16/348510
DATED : September 13, 2022
INVENTOR(S) : Sperlich et al.

It is certified that error appears in the above-identified patent and that said Letters Patent is hereby corrected as shown below:

In the Claims

Column 18, Line 59: Claim 16, Delete "claim 10" and insert -- claim 12 --

Signed and Sealed this
Eighth Day of November, 2022

Katherine Kelly Vidal
*Director of the United States Patent and Trademark Office*